United States Patent
Huang

(10) Patent No.: US 12,419,083 B2
(45) Date of Patent: Sep. 16, 2025

(54) SEMICONDUCTOR DEVICE AND MANUFACTURING METHOD THEREOF

(71) Applicant: AUO Corporation, Hsinchu (TW)

(72) Inventor: Chen-Shuo Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 364 days.

(21) Appl. No.: 17/993,835

(22) Filed: Nov. 23, 2022

(65) Prior Publication Data

US 2023/0187485 A1    Jun. 15, 2023

Related U.S. Application Data

(60) Provisional application No. 63/287,695, filed on Dec. 9, 2021.

(30) Foreign Application Priority Data

May 5, 2022    (TW) .................................. 111117041

(51) Int. Cl.
*H10D 62/10*    (2025.01)
*H10D 30/67*    (2025.01)
(Continued)

(52) U.S. Cl.
CPC ......... *H10D 62/102* (2025.01); *H10D 30/673* (2025.01); *H10D 30/6734* (2025.01);
(Continued)

(58) Field of Classification Search
CPC ............... H10D 62/102; H10D 30/673; H10D 30/6734; H10D 30/6755; H10D 30/6757; H10D 64/01; H10D 99/00; H10D 30/6736
See application file for complete search history.

(56) References Cited

U.S. PATENT DOCUMENTS 7,786,485 B2    8/2010    Dairiki et al.
8,633,486 B2    1/2014    Yamamoto
(Continued)

FOREIGN PATENT DOCUMENTS

CN    102315245    1/2012
CN    101521231    4/2013
(Continued)

*Primary Examiner* — Jay C Kim
*Assistant Examiner* — Woo K Lee
(74) *Attorney, Agent, or Firm* — JCIPRNET

(57) ABSTRACT

A semiconductor device and its manufacturing method are provided. The semiconductor device includes a substrate, an oxygen-containing protrusive structure disposed above the substrate, a metal oxide layer, a gate dielectric layer disposed on the metal oxide layer, and a gate disposed on the gate dielectric layer. The oxygen-containing protrusive structure has a first surface, a second surface opposite to the first surface, and sidewalls connected to the first and second surfaces. The metal oxide layer includes first, second, and third portions. The first portion covers the first surface. The second portion is connected to the first portion and covers the sidewalls of the oxygen-containing protrusive structure. A resistivity of the second portion gradually decreases away from the first portion. The third portion is connected to the second portion and extends from the sidewalls of the oxygen-containing protrusive structure in a direction away from the oxygen-containing protrusive structure.

12 Claims, 13 Drawing Sheets

(51) Int. Cl.
*H10D 64/01* (2025.01)
*H10D 99/00* (2025.01)

(52) U.S. Cl.
CPC ..... *H10D 30/6755* (2025.01); *H10D 30/6757* (2025.01); *H10D 64/01* (2025.01); *H10D 99/00* (2025.01); *H10D 30/6736* (2025.01)

(56) References Cited

U.S. PATENT DOCUMENTS

| | | | |
|---|---|---|---|
| 10,115,742 B2 * | 10/2018 | Yamazaki | .......... H10D 30/6723 |
| 10,580,863 B2 | 3/2020 | Angot et al. | |
| 2009/0218576 A1 | 9/2009 | Dairiki et al. | |
| 2012/0007093 A1 | 1/2012 | Yamamoto | |
| 2014/0361289 A1 | 12/2014 | Suzawa | |
| 2019/0109192 A1 | 4/2019 | Angot et al. | |
| 2019/0189805 A1 | 6/2019 | Jang | |

FOREIGN PATENT DOCUMENTS

| | | |
|---|---|---|
| CN | 206758441 | 12/2017 |
| CN | 109659234 | 4/2019 |
| CN | 108054172 | 9/2020 |

\* cited by examiner

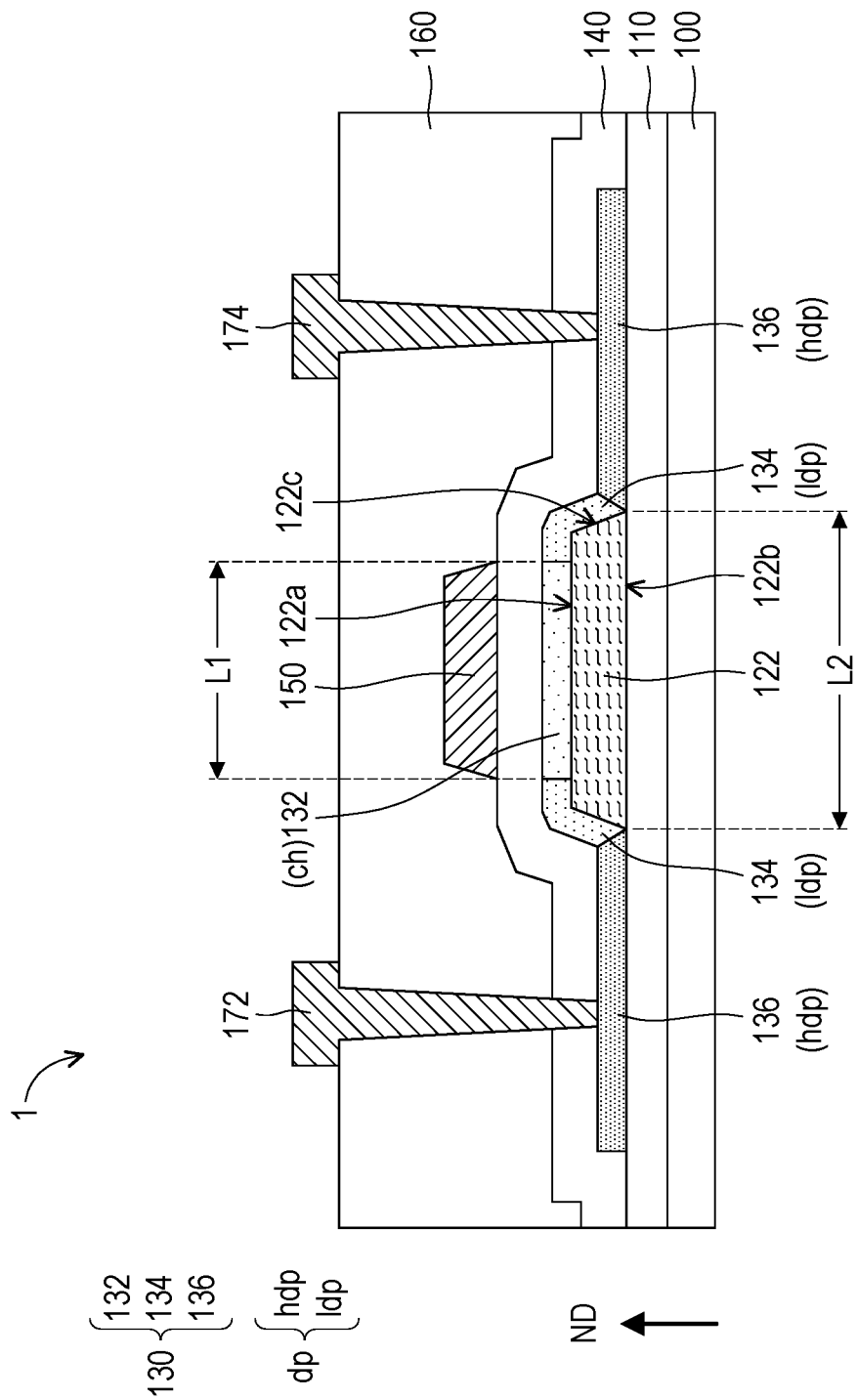

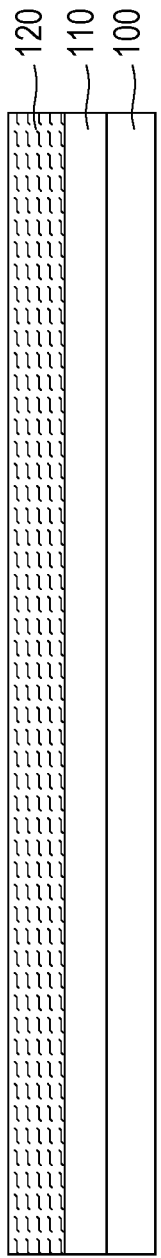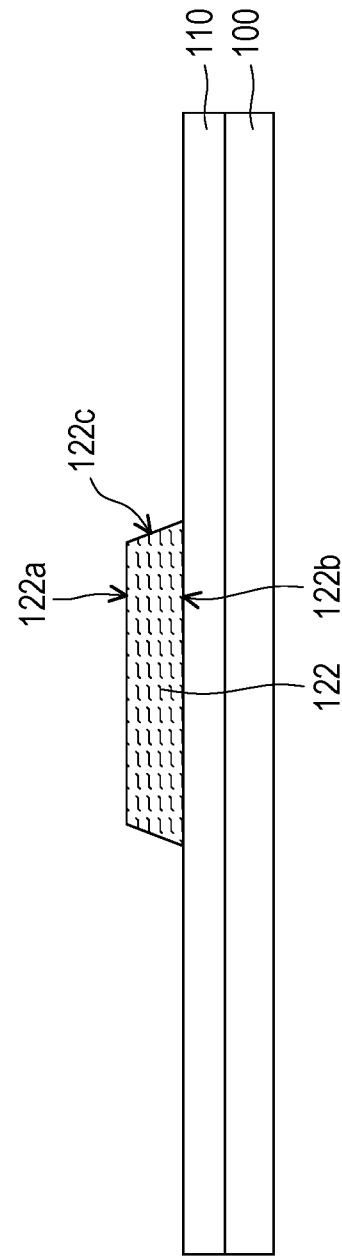

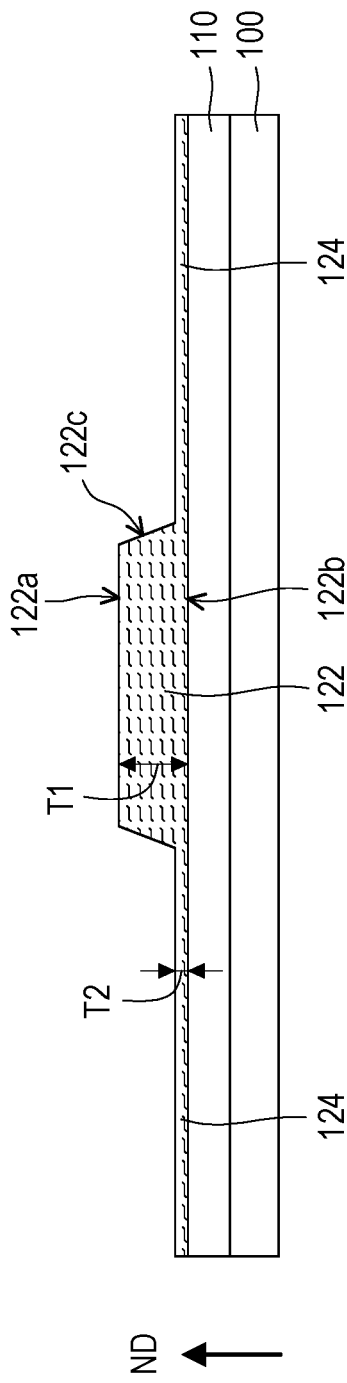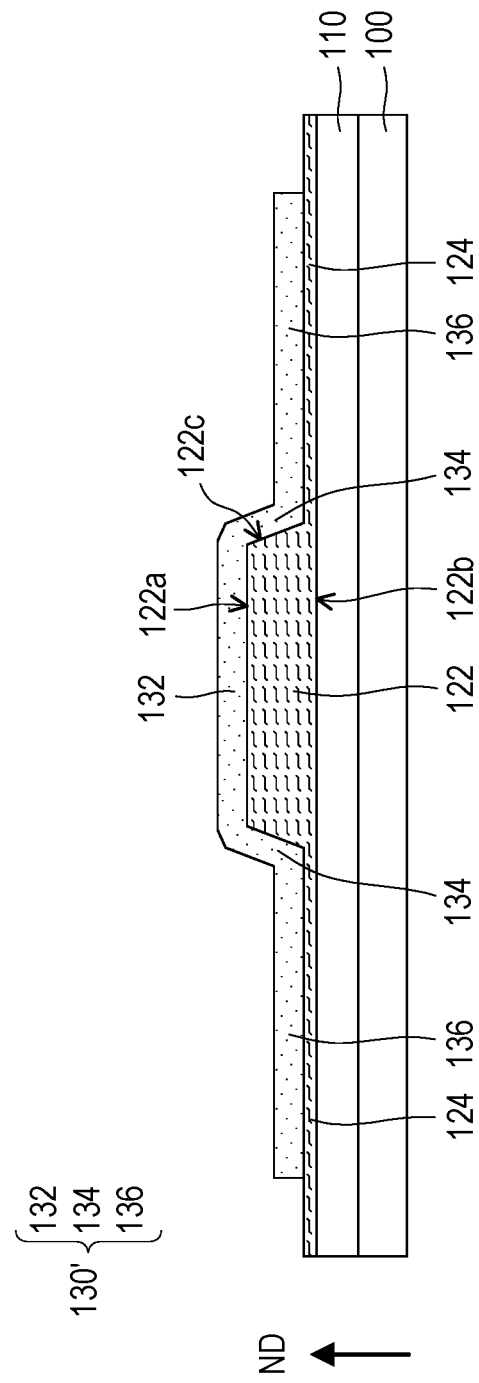

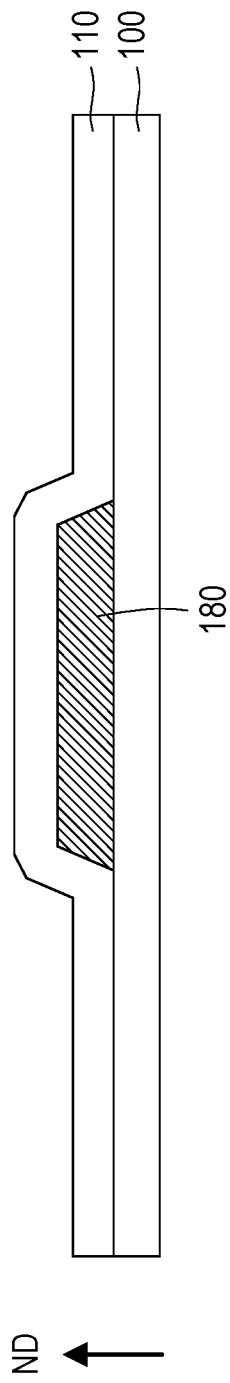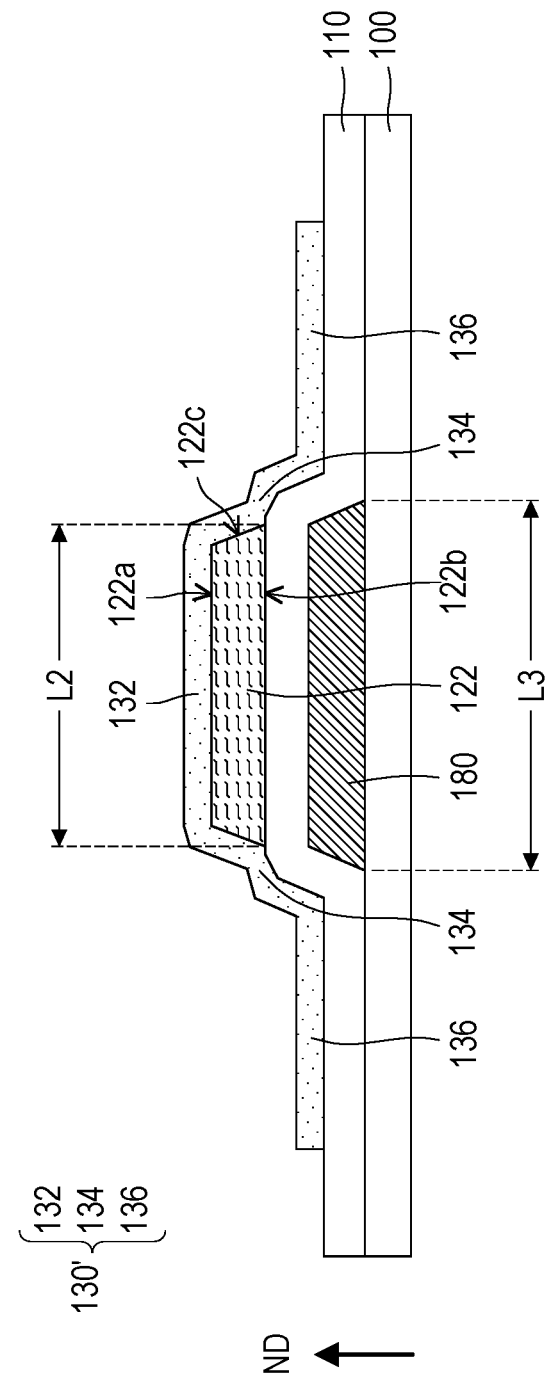

SEMICONDUCTOR DEVICE AND MANUFACTURING METHOD THEREOF

CROSS-REFERENCE TO RELATED APPLICATION

This application claims the priority benefit of U.S. provisional application Ser. No. 63/287,695, filed on Dec. 9, 2021 and Taiwan patent application serial no. 111117041, filed on May 5, 2022. The entirety of each of the above-mentioned patent applications is hereby incorporated by reference herein and made a part of this specification.

BACKGROUND

Technical Field

The disclosure relates to a semiconductor device and a manufacturing method thereof; more particularly, the disclosure relates to a semiconductor device including an oxygen-containing protrusive structure and a manufacturing method thereof.

Description of Related Art

Generally, a semiconductor layer of a thin film transistor (TFT) may be divided into a channel region and a doped region. If a carrier concentration of the doped region is high, and if a carrier concentration between the doped region and the channel region is suddenly dropped, a large lateral electric field may be accordingly generated near a drain of the TFT during an operation under a large current, and degradation of the semiconductor device may be induced. However, if the carrier concentration of the doped region is reduced to prevent said degradation of the semiconductor device, an operating current of the semiconductor device may be insufficient. Therefore, how to reduce the lateral electric field near the drain of the semiconductor device while maintaining sufficient operating current is an issue to be solved at present.

SUMMARY

The disclosure provides a semiconductor device and a manufacturing method thereof which may reduce a lateral electric field near a drain, so as to improve reliability of the semiconductor device.

In an embodiment of the disclosure, a semiconductor device that includes a substrate, an oxygen-containing protrusive structure, a metal oxide layer, a gate dielectric layer, and a first gate is provided. The oxygen-containing protrusive structure is disposed above the substrate. The oxygen-containing protrusive structure has a first surface, a second surface opposite to the first surface, and a plurality of sidewalls connected to the first surface and the second surface. The metal oxide layer includes a first portion, a second portion, and a third portion. The first portion covers the first surface of the oxygen-containing protrusive structure. The second portion is connected to the first portion and covers the sidewalls of the oxygen-containing protrusive structure. A resistivity of the second portion gradually decreases away from the first portion. The third portion is connected to the second portion and extends from the sidewalls of the oxygen-containing protrusive structure in a direction away from the oxygen-containing protrusive structure. The gate dielectric layer is disposed on the metal oxide layer. The first gate is disposed on the gate dielectric layer.

In an embodiment of the disclosure, a manufacturing method of a semiconductor device includes following steps. A substrate is provided. An oxygen-containing protrusive structure is formed above the substrate, where the oxygen-containing protrusive structure has a first surface, a second surface opposite to the first surface, and a plurality of sidewalls connected to the first surface and the second surface. A metal oxide layer is formed on the oxygen-containing protrusive structure, where the metal oxide layer includes a first portion, a second portion, and a third portion. The first portion covers the first surface of the oxygen-containing protrusive structure. The second portion is connected to the first portion and covers the sidewalls of the oxygen-containing protrusive structure. The third portion is connected to the second portion and extends from the sidewalls of the oxygen-containing protrusive structure in a direction away from the oxygen-containing protrusive structure. A gate dielectric layer is formed on the metal oxide layer. A first gate is formed on the gate dielectric layer, where the first gate is overlapped with the metal oxide layer in a normal direction of a top surface of the substrate. A doping process is performed on the metal oxide layer to reduce a resistivity of the third portion of the metal oxide layer and gradually decrease a resistivity of the second portion of the metal oxide layer away from the first portion.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1 is a schematic cross-sectional view of a semiconductor device according to an embodiment of the disclosure.

FIG. 2A to FIG. 2E are schematic cross-sectional flowcharts of a manufacturing process of the semiconductor device depicted in FIG. 1.

FIG. 4A to FIG. 4D are schematic cross-sectional flowcharts of a manufacturing process of the semiconductor device depicted in FIG. 3.

FIG. 6A to FIG. 6D are schematic cross-sectional flowcharts of a manufacturing process of the semiconductor device depicted in FIG. 5.

DESCRIPTION OF THE EMBODIMENTS

Figure 2C:
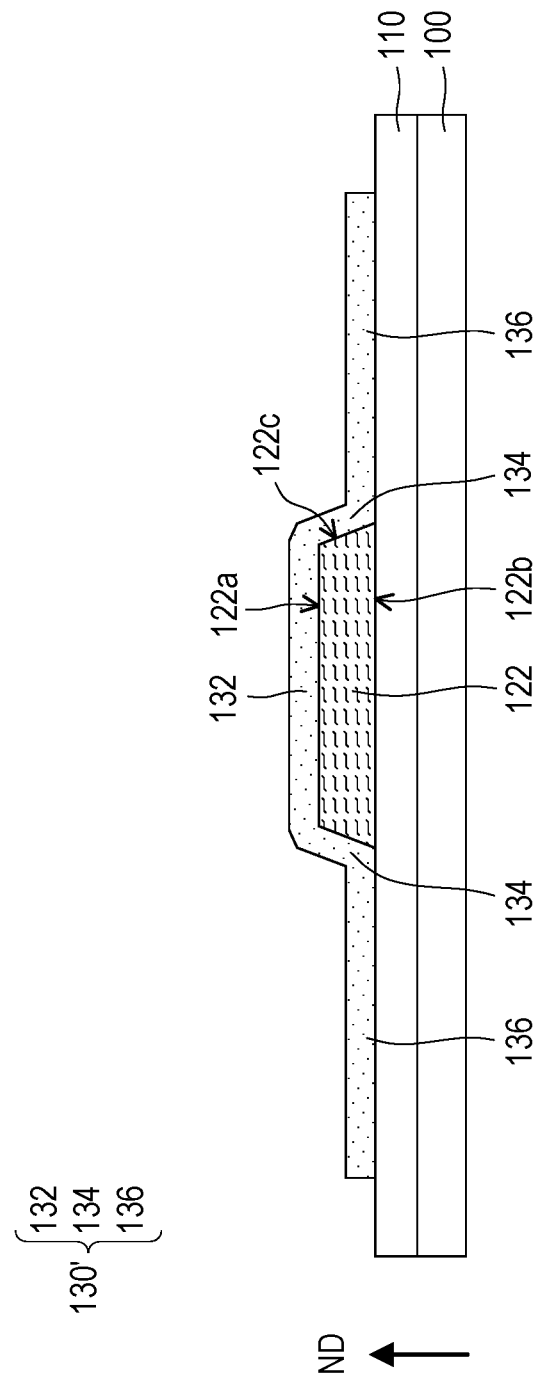

Reference is now made in detail to exemplary embodiments of the disclosure, and examples of the exemplary embodiments are described in the accompanying drawings. Whenever possible, the same reference numbers are used in the drawings and descriptions to indicate the same or similar parts.

FIG. 1 is a schematic cross-sectional view of a semiconductor device according to an embodiment of the disclosure.

With reference to FIG. 1, a semiconductor device 1 includes a substrate 100, an oxygen-containing protrusive structure 122, a metal oxide layer 130, a gate dielectric layer 140, and a first gate 150. In this embodiment, the semiconductor device 1 further includes a buffer layer 110, an interlayer dielectric layer 160, a source 172, and a drain 174.

A material of the substrate 100 may include glass, quartz, organic polymer, or an opaque/reflective material (e.g., a conductive material, metal, wafer, ceramics, or other applicable materials), or other applicable materials. If the conductive material or the metal is used, the substrate 100 is covered by an insulation layer (not shown) to prevent short circuits. In some embodiments, the substrate 100 is a flexible substrate, and the material of the substrate 100 is, for instance, polyethylene terephthalate (PET), polyethylene naphthalate (PEN), polyester (PES), polymethylmethacrylate (PMMA), polycarbonate (PC), polyimide (PI), metal foil, or other flexible materials. The buffer layer 110 is located on the substrate 100, and a material of the buffer layer 110 may include aluminum oxide, silicon nitride oxide (SiNO), silicon nitride, or other insulation materials, which should however not be construed as a limitation in the disclosure.

The oxygen-containing protrusive structure 122 is disposed above the substrate 100 and the buffer layer 110; that is, the buffer layer 110 is disposed between the substrate 100 and the oxygen-containing protrusive structure 122. The oxygen-containing protrusive structure 122 has a first surface 122a, a second surface 122b opposite to the first surface 122a, and a plurality of sidewalls 122c connected to the first surface 122a and the second surface 122b. For instance, in this embodiment, the oxygen-containing protrusive structure 122 is a trapezoidal structure, the second surface 122b faces a surface of the buffer layer 110, an area occupied by the first surface 122a is smaller than an area occupied by the second surface 122b, and the sidewalls 122c are connected to the first surface 122a and the second surface 122b to form an inclined surface. Therefore, at the sidewalls 122c of the oxygen-containing protrusive structure 122, a thickness of the oxygen-containing protrusive structure 122 gradually decreases from the center to the edge. A material of the oxygen-containing protrusive structure 122 may include silicon oxide, SiNO, or other appropriate oxygen-containing insulation materials. In some embodiments, an oxygen concentration of the oxygen-containing protrusive structure 122 is higher than an oxygen concentration of the buffer layer 110. For instance, when the material of the oxygen-containing protrusive structure 122 includes silicon oxide, and the material of the buffer layer 110 includes silicon nitride or SiNO, the oxygen concentration of the buffer layer 110 is lower than the oxygen concentration of the oxygen-containing protrusive structure 122. Alternatively, when the materials of the buffer layer 110 and the oxygen-containing protrusive structure 122 are both SiNO, the oxygen concentration of the buffer layer 110 is lower than the oxygen concentration of the oxygen-containing protrusive structure 122. In some embodiments, when the material of the buffer layer 110 includes silicon nitride or SiNO, the oxygen-containing protrusive structure 122 and the buffer layer 110 contain hydrogen atoms, and a hydrogen concentration of the buffer layer 110 is higher than a hydrogen concentration of the oxygen-containing protrusive structure 122.

The metal oxide layer 130 is located on the oxygen-containing protrusive structure 122 and the buffer layer 110. For instance, the metal oxide layer 130 includes a first portion 132, a second portion 134, and a third portion 136. The first portion 132 covers the first surface 122a of the oxygen-containing protrusive structure 122. The second portion 134 is connected to the first portion 132 and covers the sidewalls 122c of the oxygen-containing protrusive structure 122. The third portion 136 is connected to the second portion 134 and extends from the sidewalls 122c of the oxygen-containing protrusive structure 122 in a direction away from the oxygen-containing protrusive structure 122. In some embodiments, a material of the metal oxide layer 130 includes quaternary metal compounds, such as indium gallium zinc oxide (IGZO), indium tin zinc oxide (ITZO), aluminum zinc tin oxide (AZTO), indium tungsten zinc oxide (IWZO), and so forth, or includes oxides composed of any three of the following ternary metals: gallium (Ga), zinc (Zn), indium (In), tin (Sn), aluminum (Al), and tungsten (W).

The gate dielectric layer 140 is disposed on the metal oxide layer 130 and the buffer layer 110, and the first gate 150 is disposed on the gate dielectric layer 140. The first gate 150 is overlapped with the first portion 132 in a normal direction ND of a top surface of the substrate 100 but is not overlapped with the second portion 134 nor the third portion 136. In other words, the first portion 132 of the metal oxide layer 130 may constitute a channel region ch, and the second portion 134 and the third portion 136 may constitute a doped region dp. In some embodiments, the second portion 134 may constitute a lightly doped region ldp, and the third portion 136 may constitute a heavily doped region hdp.

The oxygen-containing protrusive structure 122 may provide an oxygen element to the metal oxide layer 130 in the manufacturing process. The larger the thickness of the oxygen-containing protrusive structure 122 is, the more oxygen the oxygen-containing protrusive structure may provide to the metal oxide layer 130; the smaller the thickness of the oxygen-containing protrusive structure 122 is, the less oxygen the oxygen-containing protrusive structure may provide. The higher the oxygen concentration of the metal oxide layer 130, the higher the resistivity of the metal oxide layer 130. On the contrary, the lower the oxygen concentration of the metal oxide layer 130, the lower the resistivity of the metal oxide layer 130. In other words, the thickness of the oxygen-containing protrusive structure 122 affects the oxygen concentration of the metal oxide layer 130 and further poses an impact on its resistivity. For instance, the first portion 132 of the metal oxide layer 130 covers a central portion of the oxygen-containing protrusive structure 122 of a relatively large thickness, and most of the second portion 134 of the metal oxide layer 130 covers an edge portion of the oxygen-containing protrusive structure 122 of a gradually reduced thickness. Therefore, the oxygen concentration of the first portion 132 is higher than the oxygen concentration of the second portion 134, and the resistivity of the first portion 132 is higher than the resistivity of the second portion 134. Since the thickness of the edge portion of the oxygen-containing protrusive structure 122 covered by the second portion 134 gradually decreases in a direction away from the first portion 132, the oxygen concentration of the second portion 134 also gradually decreases in the direction away from the first portion 132, so that the resistivity of the second portion 134 gradually decreases away from the first portion 132. As such, the issue of a lateral electric field generated due to a sudden change to the resistivity of the metal oxide layer 130 may be solved to a great extent by arranging the second portion 134, thereby improving the reliability of the semiconductor device 1.

In this embodiment, since a width L1 of the first gate 150 is slightly smaller than a width of the first surface 122a of the oxygen-containing protrusive structure 122, the second portion 134 in the doped region dp partially covers a part of the first surface 122a of the oxygen-containing protrusive structure 122, which should however not be construed as a limitation in the disclosure. In other embodiments, since the width L1 of the first gate 150 is slightly larger than or equal to the width of the first surface 122a of the oxygen-containing protrusive structure 122, the second portion 134 in the doped region dp does not cover the first surface 122a of the oxygen-containing protrusive structure 122.

The third portion 136 of the metal oxide layer 130 is not in contact with the oxygen-containing protrusive structure 122, and therefore the third portion 136 has a lower oxygen concentration than that of the first portion 132 and that of the second portion 134. That is, the resistivity of the first portion 132 and the resistivity of the second portion 134 are both higher than the resistivity of the third portion 136.

The interlayer dielectric layer 160 is disposed on the gate dielectric layer 140 and covers the first gate 150. A material of the interlayer dielectric layer 160 and the gate dielectric layer 140 includes, for instance, silicon oxide, silicon nitride, SiNO, or other appropriate materials. The source 172 and the drain 174 are located on the interlayer dielectric layer 160 and penetrate the interlayer dielectric layer 160 and the gate dielectric layer 140, so as to be electrically connected to the third portion 136 of the metal oxide layer 130. Since the resistivity of the third portion 136 is smaller than the resistivity of the second portion 134, an interface resistance between the source 172 and the third portion 136 and an interface resistance between the drain 174 and the third portion 136 may be reduced, thereby increasing an operating current of the semiconductor device 1.

For the purpose of clarity, in FIG. 1, a clear boundary line is illustrated between the first portion 132 and the second portion 134 and between the second portion 134 and the third portion 136 of the metal oxide layer 130, but it should be understood that these boundary lines are only provided for explanation. In the actual structure, there may be no such clear boundary lines because of the gradual changes between the first portion 132 and the second portion 134 and between the second portion 134 and the third portion 136.

FIG. 2A to FIG. 2E are schematic cross-sectional flowcharts of a manufacturing process of the semiconductor device depicted in FIG. 1.

With reference to FIG. 2A, a substrate 100 is provided, a buffer layer 110 is formed on the substrate 100, and an oxygen-containing material layer 120 is deposited on the substrate 100 and the buffer layer 110.

With reference to FIG. 2B, the oxygen-containing material layer 120 is patterned by performing a dry etching process or a wet etching process to expose a partial surface of the buffer layer 110, whereby an oxygen-containing protrusive structure 122 is formed. The oxygen-containing protrusive structure 122 is, for instance, a trapezoidal structure and has a first surface 122a, a second surface 122b opposite to the first surface 122a, and a plurality of sidewalls 122c connected to the first surface 122a and the second surface 122b.

With reference to FIG. 2C, a metal oxide layer 130' is conformally formed on the oxygen-containing protrusive structure 122 and the buffer layer 110. The metal oxide layer 130' may include a first portion 132, a second portion 134, and a third portion 136. The first portion 132 covers the first surface 122a of the oxygen-containing protrusive structure 122. The second portion 134 is connected to the first portion 132 and covers the sidewalls 122c of the oxygen-containing protrusive structure 122. The third portion 136 is connected to the second portion 134 and extends from the sidewalls 122c of the oxygen-containing protrusive structure 122 in a direction away from the oxygen-containing protrusive structure 122.

Figure 2D:
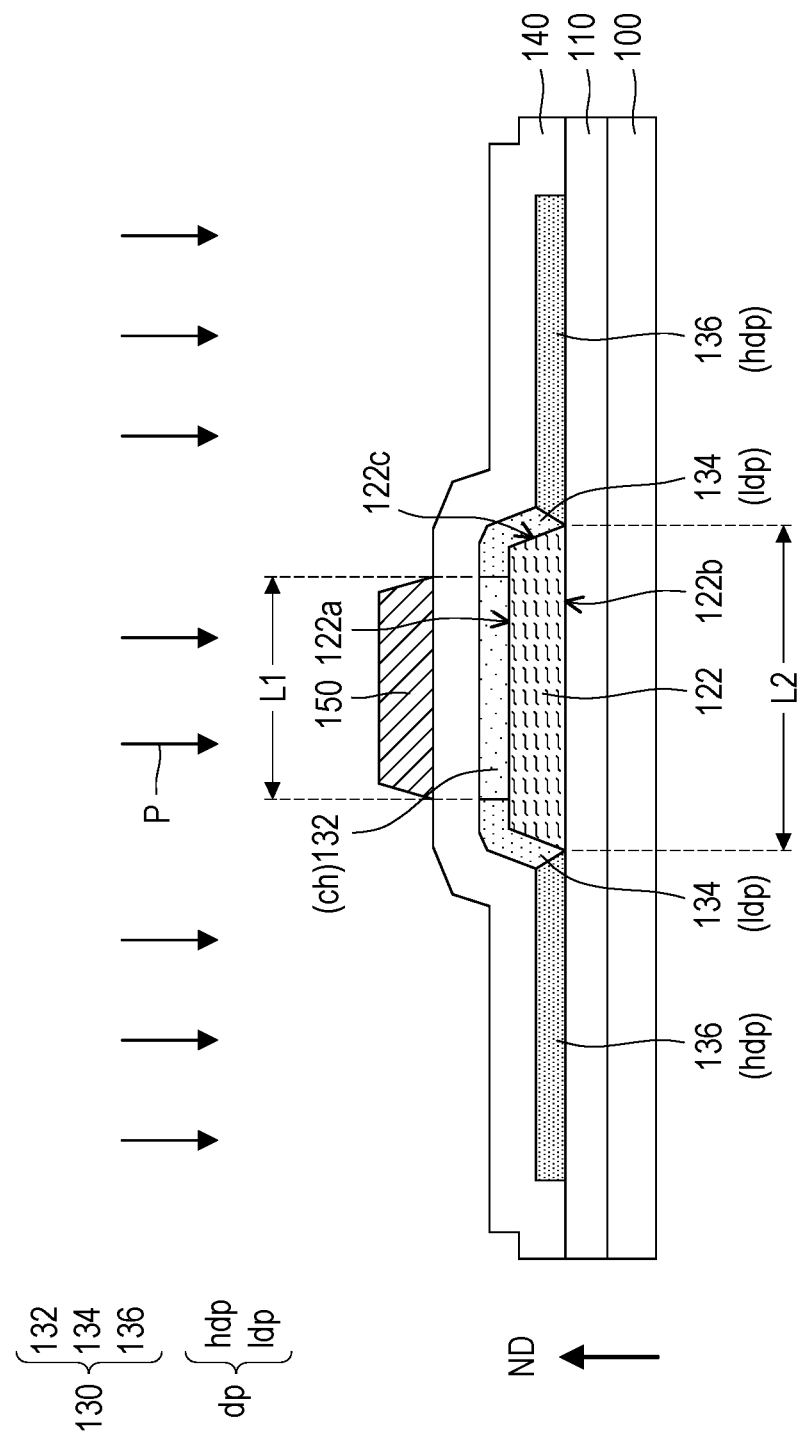

With reference to FIG. 2D, a gate dielectric layer 140 is formed on the metal oxide layer 130', and a first gate 150 is formed on the gate dielectric layer 140, where the first gate 150 is overlapped with the metal oxide layer 130' in a normal direction ND of a top surface of the substrate 100. For instance, the first gate 150 may be overlapped with the first portion 132 in the normal direction ND of the top surface of the substrate 100.

In some embodiments, before the gate dielectric layer 140 and the first gate 150 are formed, an annealing process may be performed on the metal oxide layer 130' or the gate dielectric layer 140 to adjust an oxygen distribution in the metal oxide layer 130' by the oxygen-containing protrusive structure 122. For instance, the first portion 132 and the second portion 134 of the metal oxide layer 130' are located on the oxygen-containing protrusive structure 122, and thus the oxygen-containing protrusive structure 122 may provide oxygen to the first portion 132 and the second portion 134 in the annealing process; the third portion 136 is not formed on the oxygen-containing protrusive structure 122, and thus the oxygen in the third portion 136 may be easily dissipated, so that the oxygen concentration of the third portion 136 is lower than the oxygen concentration of the first portion 132 and the oxygen concentration of the second portion 134. In other embodiments, the annealing process is performed on the metal oxide layer 130' or the gate dielectric layer 140 after the gate dielectric layer 140 is formed and before the first gate 150 is formed to adjust the oxygen distribution in the metal oxide layer 130' by the oxygen-containing protrusive structure 122. For instance, the oxygen-containing protrusive structure 122 may provide oxygen to the first portion 132 and the second portion 134 in the annealing process, so as to increase the oxygen concentration of the first portion 132 and the oxygen concentration of the second portion 134, which allows the oxygen concentration of the first portion 132 and the oxygen concentration of the second portion 134 to be higher than the oxygen concentration of the third portion 136.

With reference to FIG. 2D, a doping process P is performed on the metal oxide layer 130 to reduce the resistivity of the third portion 136 of the metal oxide layer 130 and gradually decrease the resistivity of the second portion 134 of the metal oxide layer 130 away from the first portion 132. For instance, a hydrogen plasma process is performed on the metal oxide layer 130 by applying the first gate 150 as a mask, so that the second portion 134 and the third portion 136 that are not overlapped with the first gate 150 in the normal direction ND of the top surface of the substrate 100 constitute a doped region dp, and the first portion 132 overlapped with the first gate 150 in the normal direction ND of the top surface of the substrate 100 constitutes a channel region ch. In some embodiments, the second portion 134 may constitute a lightly doped region ldp, and the third portion 136 may constitute a heavily doped region hdp. In some embodiments, a width L2 of the oxygen-containing protrusive structure 122 may be larger than a width L1 of the first gate 150, which is conducive to an increase in the distance between the first portion 132 and the third portion 136.

During the hydrogen plasma process, the oxygen in the metal oxide layer 130 may react with hydrogen to create oxygen vacancies in the metal oxide layer 130, thereby reducing the resistivity of the metal oxide layer 130. Besides, the thickness of the oxygen-containing protrusive structure 122 covered by the second portion 134 gradually decreases, and the third portion 136 is not in contact with the oxygen-containing protrusive structure 122; therefore, the oxygen concentration of the second portion 134 gradually decreases in the direction away from the first portion 132, and the oxygen concentration of the second portion 134 is higher than the oxygen concentration of the third portion 136. As a result, after the hydrogen plasma process, the resistivity of the second portion 134 may gradually decrease from the first portion 132, and the resistivity of the second portion 134 is higher than the resistivity of the third portion 136.

Figure 2E:
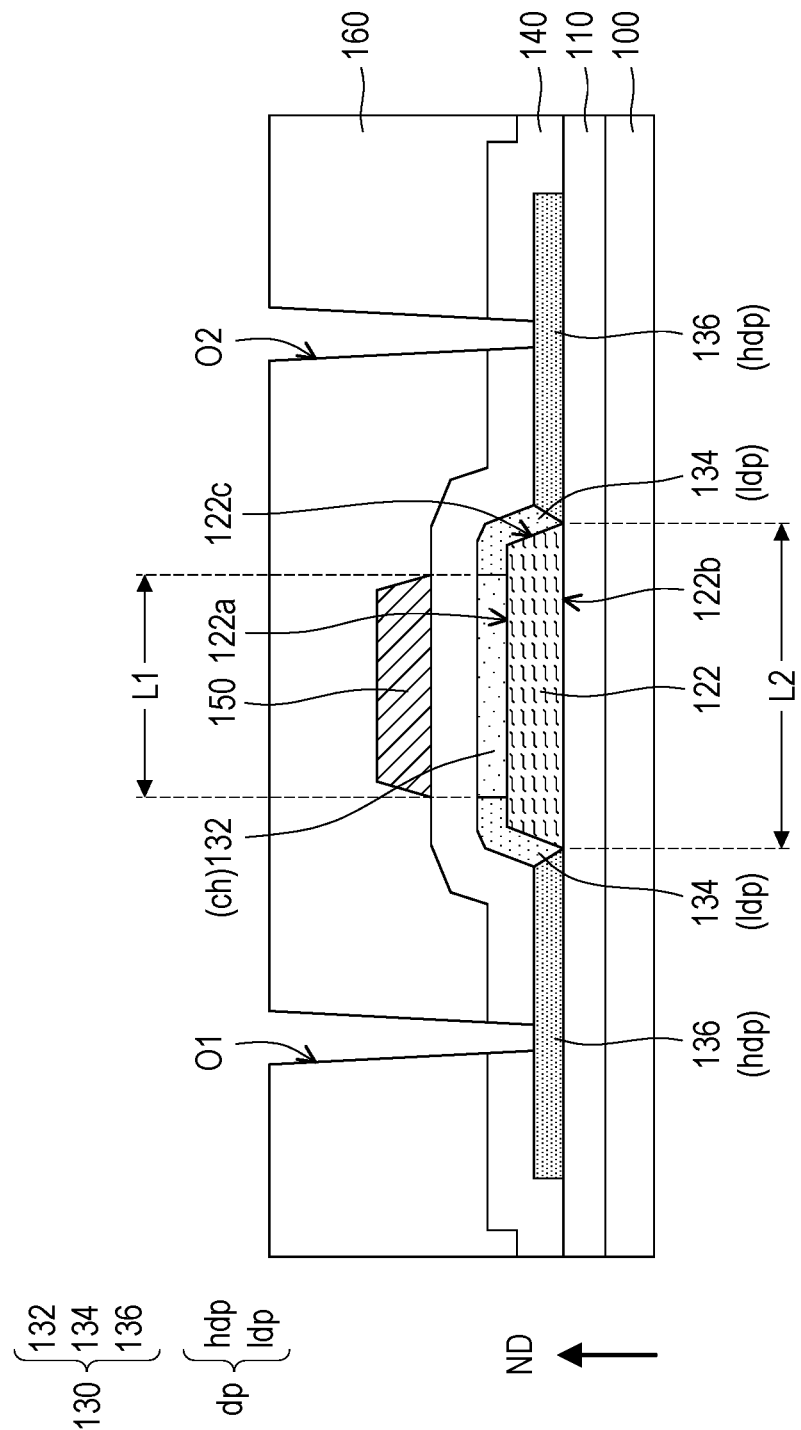

With reference to FIG. 2E, an interlayer dielectric layer 160 is formed on the gate dielectric layer 140 and covers the first gate 150. After that, openings O1 and O2 penetrating the interlayer dielectric layer 160 and the gate dielectric layer 140 are formed, and the openings O1 and O2 are respectively overlapped with the third portion 136 in the normal direction ND of the top surface of the substrate 100.

After that, with reference to FIG. 1, a source 172 and a drain 174 are formed on the interlayer dielectric layer 150 and fill the openings O1 and O2, so as to be electrically connected to the metal oxide layer 130.

After the above process, the fabrication of the semiconductor device 1 is substantially completed.

Figure 3:
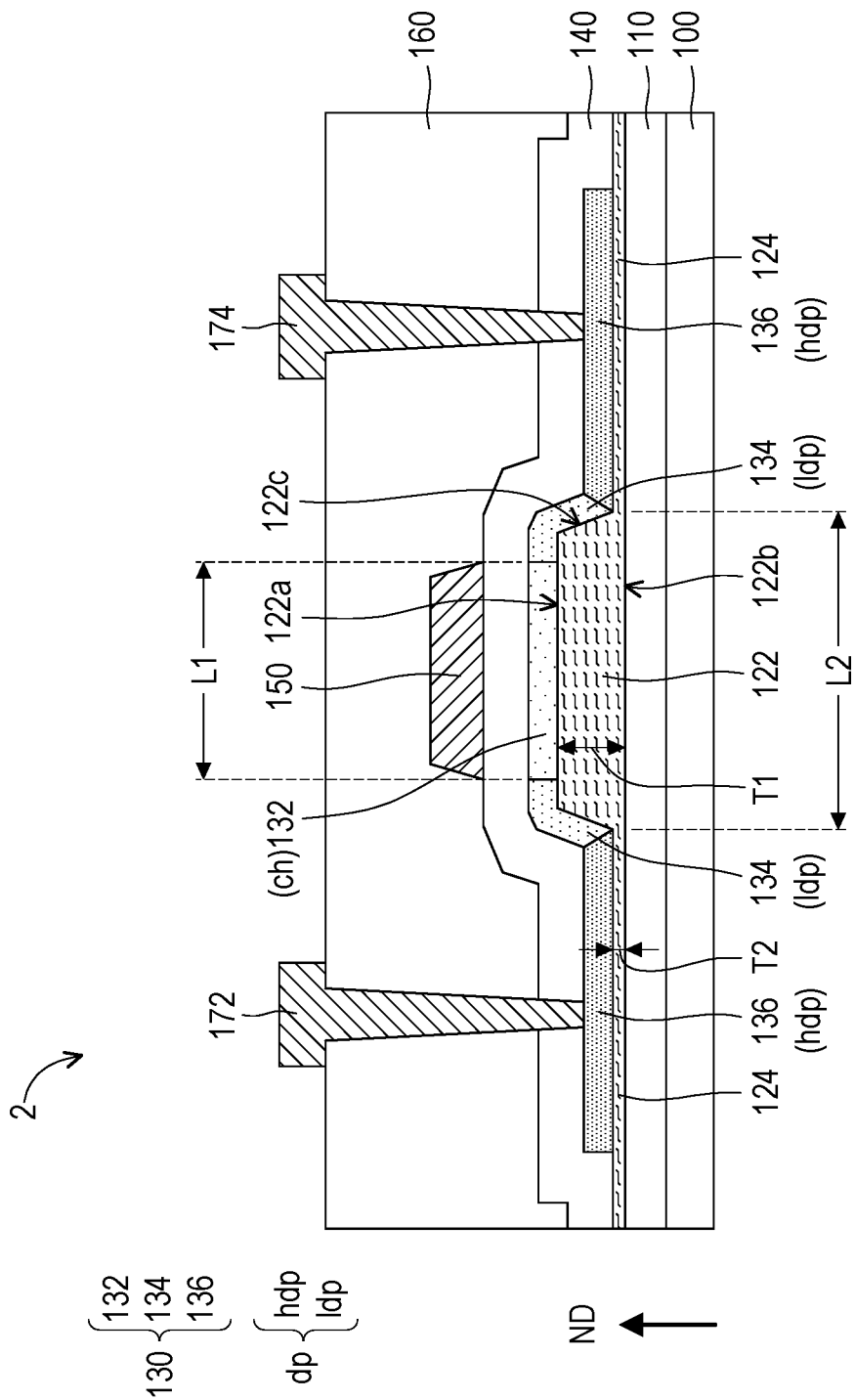
FIG. 3 is a schematic cross-sectional view of a semiconductor device according to another embodiment of the disclosure.

FIG. 3 is a schematic cross-sectional view of a semiconductor device according to another embodiment of the disclosure. Note that the reference numbers and some contents provided in the embodiment depicted in FIG. 1 are used in the embodiment depicted in FIG. 3, where the same or similar numbers are applied to denote the same or similar elements, and the description of the same technical content is omitted. The description of the omitted content may be found in the previous embodiment and will not be provided hereinafter.

With reference to FIG. 3, the main difference between a semiconductor device 2 shown in FIG. 3 and the semiconductor device 1 shown in FIG. 1 lies in that the semiconductor device 2 further includes an extension structure 124. The extension structure 124 is located between the third portion 136 of the metal oxide layer 130 and the substrate 100 and is connected to the oxygen-containing protrusive structure 122 integrally, and a thickness T1 of the oxygen-containing protrusive structure 122 between the first surface 122a and the second surface 122b is larger than a thickness T2 of the extension structure 124. A material of the extension structure 124 is the same as the material of the oxygen-containing protrusive structure 122. The thickness of the oxygen-containing protrusive structure 122 gradually decreases with proximity to the edge, and the thickness T1 of the oxygen-containing protrusive structure 122 between the first surface 122a and the second surface 122b is larger than the thickness T2 of the extension structure 124; hence, the oxygen concentration of the first portion 132 is higher than the oxygen concentration of the second portion 134, and the oxygen concentration of the second portion 134 is higher than the oxygen concentration of the third portion 136. Thereby, the resistivity of the first portion 132 is higher than the resistivity of the second portion 134, and the resistivity of the second portion 134 is higher than the resistivity of the third portion 136. In addition, since the thickness of a part of the oxygen-containing protrusive structure 122 covered by the second portion 134 gradually decreases with proximity to the edge, the oxygen concentration of the second portion 134 gradually decreases in the direction away from the first portion 132, so that the resistivity of the second portion 134 gradually decreases in the direction away from the first portion 134. As such, the issue of a lateral electric field generated due to a sudden change to the resistivity of the metal oxide layer 130 may be solved to a great extent by arranging the second portion 134, thereby improving the reliability of the semiconductor device 2. Besides, since the resistivity of the third portion 136 is smaller than the resistivity of the second portion 134, the interface resistance between the source 172 and the third portion 136 and the interface resistance between the drain 174 and the third portion 136 may be reduced, thereby increasing an operating current of the semiconductor device 2.

FIG. 4A to FIG. 4D are schematic cross-sectional flowcharts of a manufacturing process of the semiconductor device depicted in FIG. 3. Here, FIG. 4A to FIG. 4D may be considered as schematic cross-sectional views of the manufacturing method of the semiconductor device following the steps depicted in FIG. 2A. The description of the steps in FIG. 2A may be found in the previous embodiment and will not be provided hereinafter.

With reference to FIG. 4A, an oxygen-containing material layer 120 is patterned by performing a dry etching process or a wet etching process, so as to remove a part of the oxygen-containing material layer 120 without exposing the surface of a buffer layer 110 covered by the oxygen-containing material layer 120, so as to form an oxygen-containing structure 122 and an extension structure 124. The oxygen-containing protrusive structure 122 is, for instance, a trapezoidal structure and has a first surface 122a, a second surface 122b opposite to the first surface 122a, and a plurality of sidewalls 122c connected to the first surface 122a and the second surface 122b. The extension structure 124 is integrally connected to the oxygen-containing protrusive structure 122, and a thickness T1 of the oxygen-containing protrusive structure 122 between the first surface 122a and the second surface 122b is larger than a thickness T2 of the extension structure 124.

With reference to FIG. 4B, a metal oxide layer 130' is conformally formed on the oxygen-containing protrusive structure 122 and an extension structure 124. The metal oxide layer 130' may include a first portion 132, a second portion 134, and a third portion 136. The first portion 132 covers the first surface 122a of the oxygen-containing protrusive structure 122. The second portion 134 is connected to the first portion 132 and covers the sidewalls 122c of the oxygen-containing protrusive structure 122. The third portion 136 is connected to the second portion 134 and extends from the sidewalls 122c of the oxygen-containing protrusive structure 122 in a direction away from the oxygen-containing protrusive structure 122. The extension structure 124 is located between the third portion 136 and the buffer layer 110.

Figure 4C:
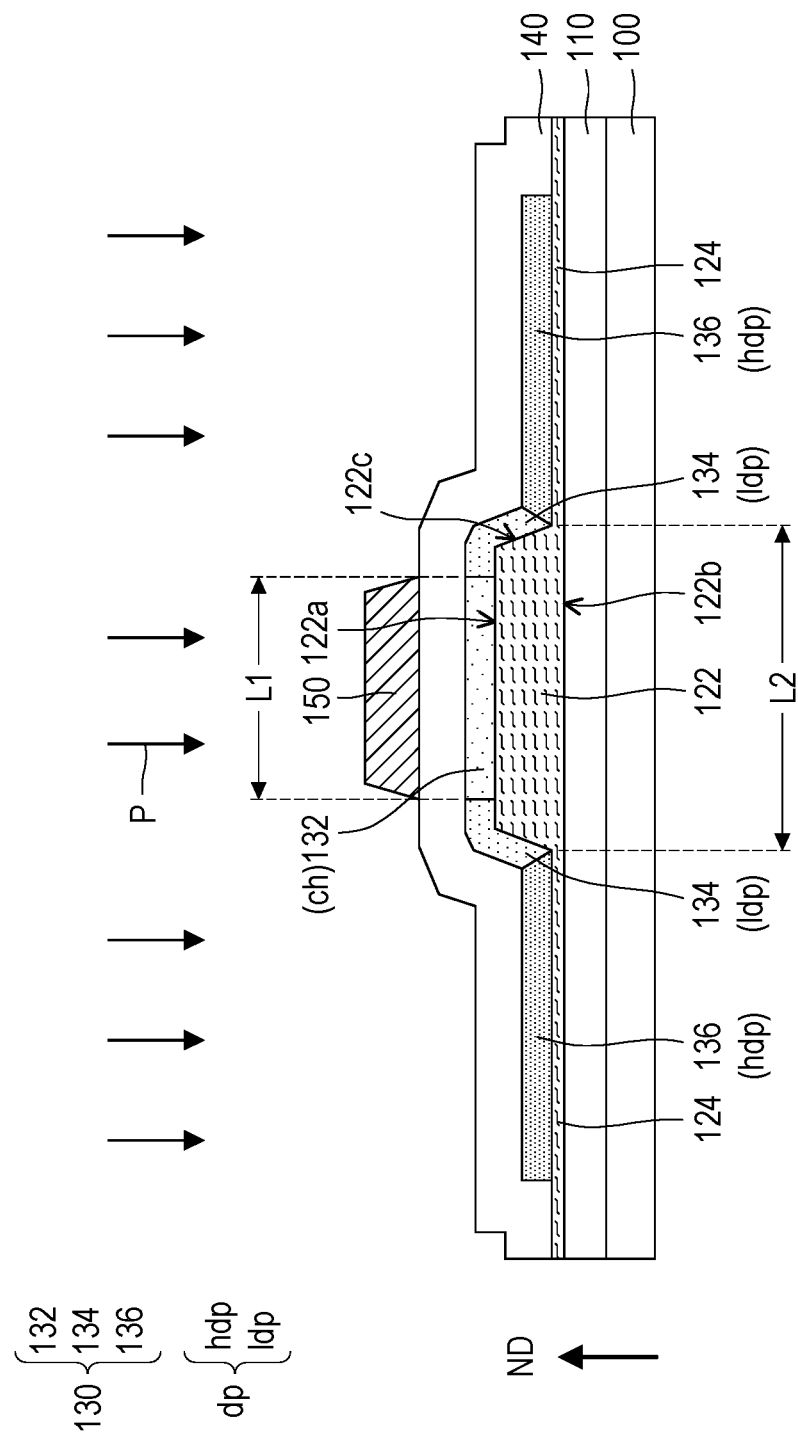

With reference to FIG. 4C, a gate dielectric layer 140 is formed on the metal oxide layer 130', and a first gate 150 is formed on the gate dielectric layer 140, where the first gate 150 is overlapped with the metal oxide layer 130' in a normal direction ND of a top surface of the substrate 100. For instance, the first gate 150 may be overlapped with the first portion 132 in the normal direction ND of the top surface of the substrate 100.

In some embodiments, before the gate dielectric layer 140 and the first gate 150 are formed, an annealing process may be performed on the metal oxide layer 130' or the gate dielectric layer 140 to adjust an oxygen distribution in the metal oxide layer 130' by the oxygen-containing protrusive structure 122. In other embodiments, the annealing process is performed on the metal oxide layer 130' or the gate dielectric layer 140 after the gate dielectric layer 140 is formed and before the first gate 150 is formed to adjust the oxygen distribution in the metal oxide layer 130' by the oxygen-containing protrusive structure 122.

With reference to FIG. 4C, a doping process P is performed on the metal oxide layer 130 to reduce the resistivity of the third portion 136 of the metal oxide layer 130 and gradually decrease the resistivity of the second portion 134 of the metal oxide layer 130 away from the first portion 132. For instance, a hydrogen plasma process is performed on the metal oxide layer 130 by applying the first gate 150 as a mask, so that the second portion 134 and the third portion 136 that are not overlapped with the first gate 150 in the normal direction ND of the top surface of the substrate 100 constitute a doped region dp, and the first portion 132 overlapped with the first gate 150 in the normal direction ND of the top surface of the substrate 100 constitutes a channel region ch. In some embodiments, the second portion 134 may constitute a lightly doped region ldp, and the third portion 136 may constitute a heavily doped region hdp. In some embodiments, a width L2 of the oxygen-containing protrusive structure 122 may be larger than a width L1 of the first gate 150, which is conducive to an increase in the distance between the first portion 132 and the third portion 136.

After the hydrogen plasma process, the resistivity of the second portion 134 may gradually decrease away from the first portion 132, and the resistivity of the second portion 134 is higher than the resistivity of the third portion 136.

Figure 4D:
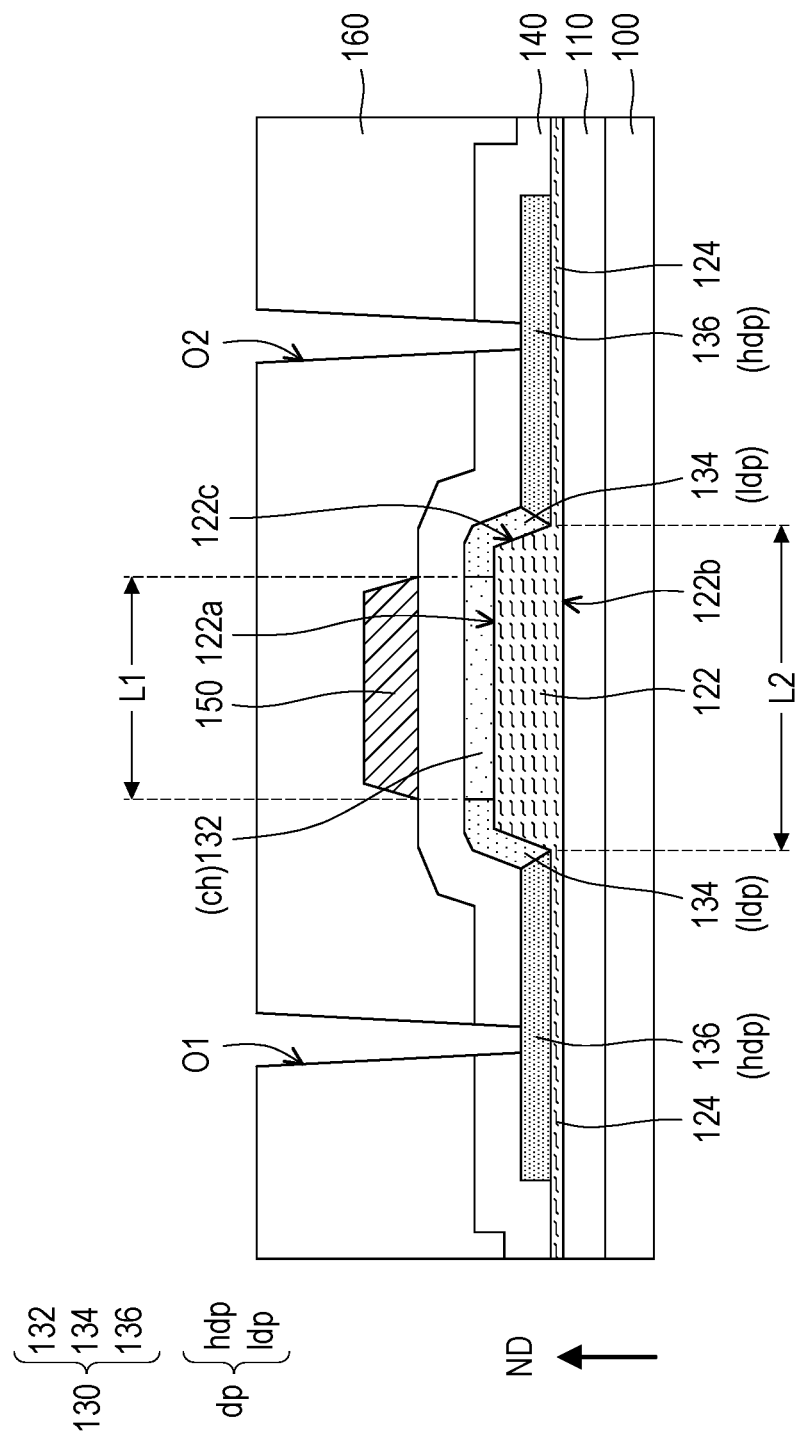

With reference to FIG. 4D, an interlayer dielectric layer 160 is formed on the gate dielectric layer 140 and covers the first gate 150. After that, openings O1 and O2 penetrating the interlayer dielectric layer 160 and the gate dielectric layer 140 are formed, and the openings O1 and O2 are respectively overlapped with the third portion 136 in the normal direction ND of the top surface of the substrate 100.

After that, with reference to FIG. 3, a source 172 and a drain 174 are formed on the interlayer dielectric layer 150 and fill the openings O1 and O2, so as to be electrically connected to the metal oxide layer 130.

After the above process, the fabrication of the semiconductor device 2 is substantially completed.

Figure 5:
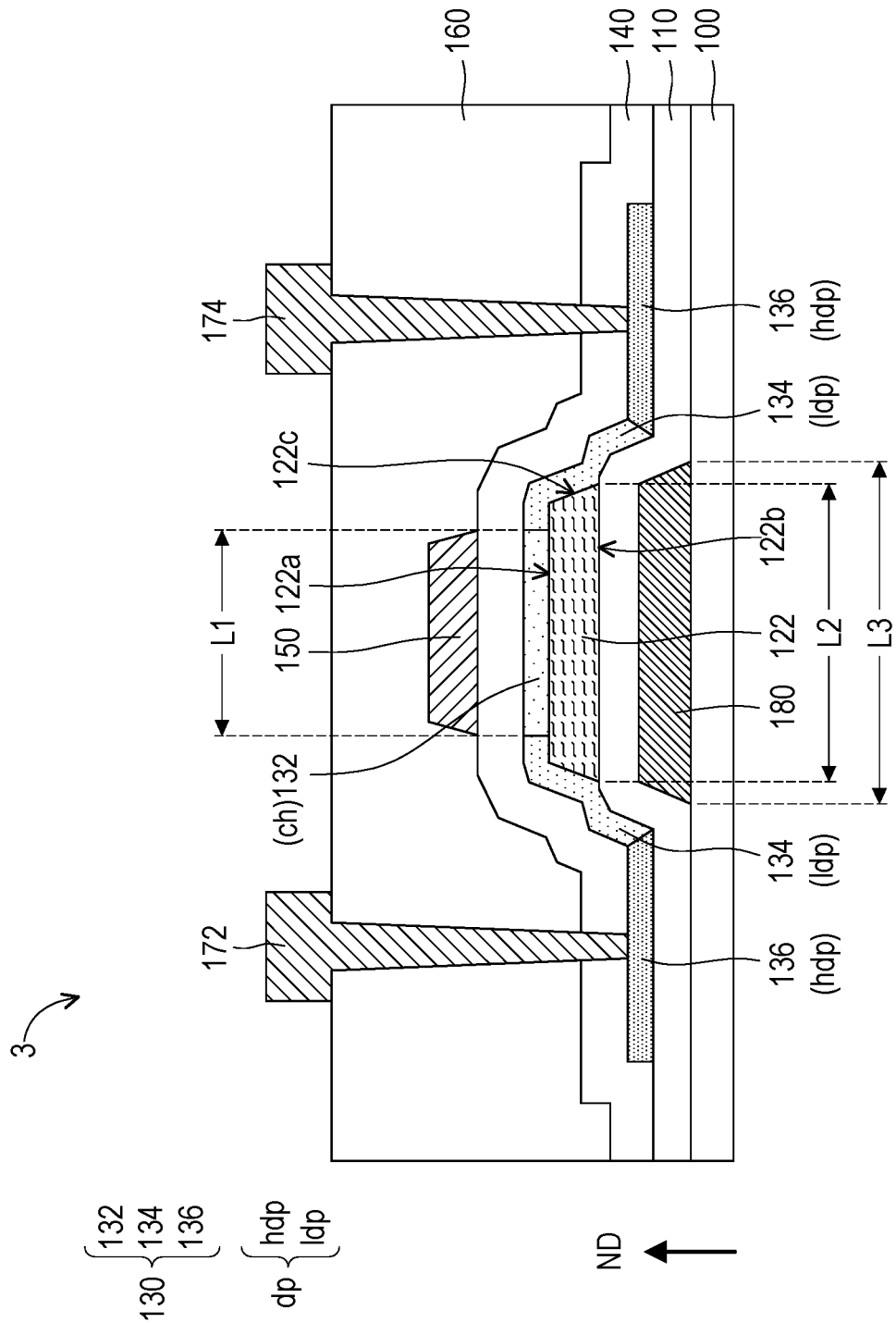
FIG. 5 is a schematic cross-sectional view of a semiconductor device according to still another embodiment of the disclosure.

FIG. 5 is a schematic cross-sectional view of a semiconductor device according to still another embodiment of the disclosure. Note that the reference numbers and some contents provided in the embodiment depicted in FIG. 1 are used in the embodiment depicted in FIG. 5, where the same or similar numbers are applied to denote the same or similar elements, and the description of the same technical content is omitted. The description of the omitted content may be found in the previous embodiment and will not be provided hereinafter.

With reference to FIG. 5, the main difference between a semiconductor device 3 shown in FIG. 5 and the semiconductor device 1 shown in FIG. 1 lies in that the semiconductor device 3 further includes a second gate 180 which may be disposed between the substrate 100 and the oxygen-containing protrusive structure 122. For instance, the second gate 180 is disposed between the substrate 100 and the buffer layer 110. That is, the semiconductor device 3 is a dual-gate transistor, and thus the performance and the stability of the semiconductor device 3 may be improved. A width L3 of the second gate 180 may be larger than the width L2 of the oxygen-containing protrusive structure 122, so as to separate the electric field between the gate and the drain in the semiconductor device 3, thereby improving the reliability of the semiconductor device 3.

FIG. 6A to FIG. 6D are schematic cross-sectional flowcharts of a manufacturing process of the semiconductor device depicted in FIG. 5.

With reference to FIG. 6A, a substrate 100 is provided, a second gate 180 is formed on the substrate 100, and a buffer layer 110 is formed on the second gate 180 and the substrate 100 and covers the second gate 180.

With reference to FIG. 6B, an oxygen-containing protrusive structure 122 is formed on the buffer layer 110. The oxygen-containing protrusive structure 122 is, for instance, a trapezoidal structure and has a first surface 122a, a second surface 122b opposite to the first surface 122a, and a plurality of sidewalls 122c connected to the first surface 122a and the second surface 122b. After that, a metal oxide layer 130' is conformally formed on the oxygen-containing protrusive structure 122 and the buffer layer 110. The metal oxide layer 130' may include a first portion 132, a second portion 134, and a third portion 136. The first portion 132 covers the first surface 122a of the oxygen-containing protrusive structure 122. The second portion 134 is connected to the first portion 132 and covers the sidewalls 122c of the oxygen-containing protrusive structure 122. The third portion 136 is connected to the second portion 134 and extends from the sidewalls 122c of the oxygen-containing protrusive structure 122 in a direction away from the oxygen-containing protrusive structure 122. In an embodiment, the width L3 of the second gate 180 may be larger than the width L2 of the oxygen-containing protrusive structure 122.

Figure 6C:
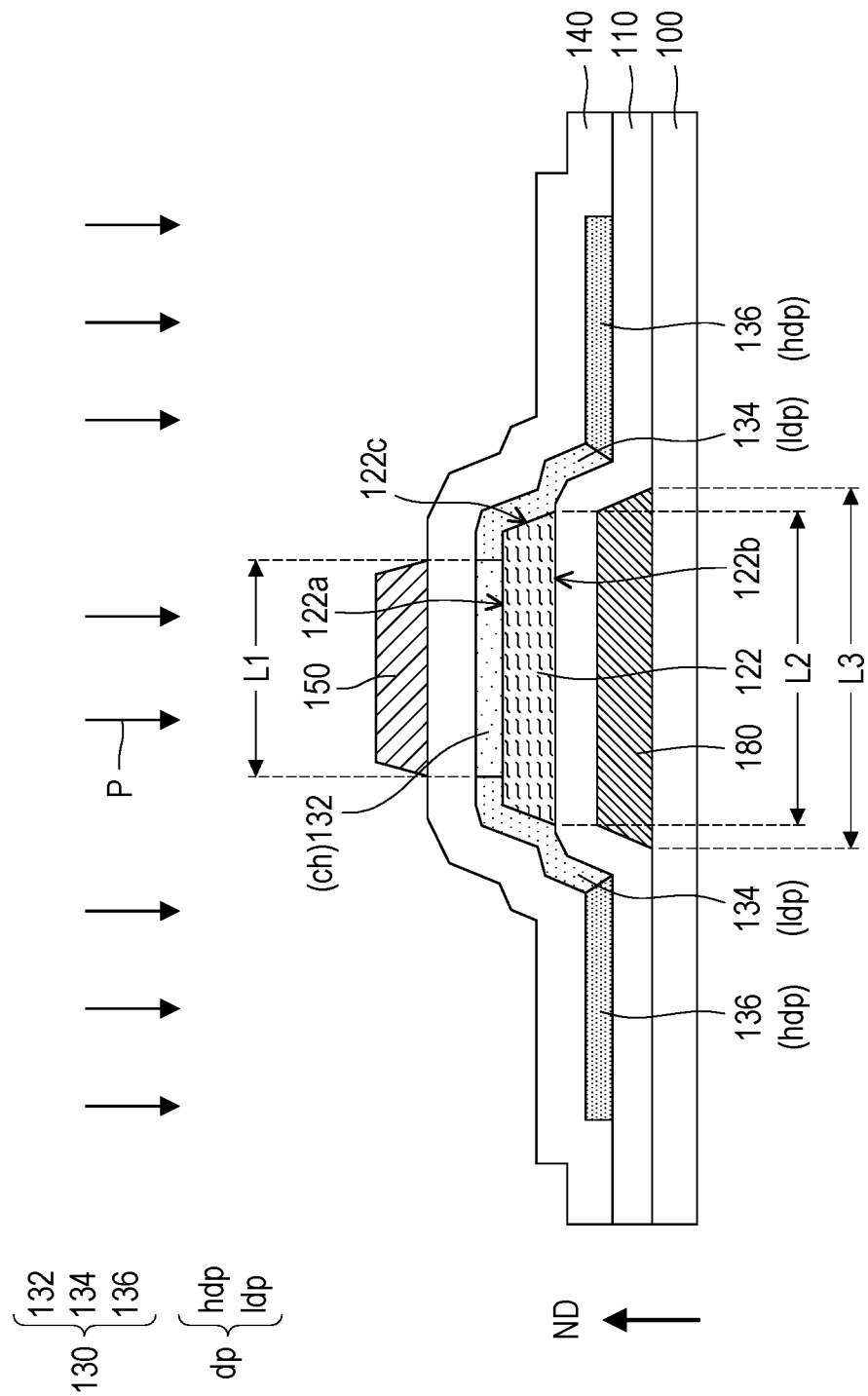

With reference to FIG. 6C, a gate dielectric layer 140 is formed on the metal oxide layer 130', and a first gate 150 is formed on the gate dielectric layer 140, where the first gate 150 is overlapped with the metal oxide layer 130' in a normal direction ND of a top surface of the substrate 100. For instance, the first gate 150 may be overlapped with the first portion 132 in the normal direction ND of the top surface of the substrate 100.

In some embodiments, before the gate dielectric layer 140 and the first gate 150 are formed, an annealing process may be performed on the metal oxide layer 130' or the gate dielectric layer 140 to adjust an oxygen distribution in the metal oxide layer 130' by the oxygen-containing protrusive structure 122. In other embodiments, the annealing process is performed on the metal oxide layer 130' or the gate dielectric layer 140 after the gate dielectric layer 140 is formed and before the first gate 150 is formed to adjust the oxygen distribution in the metal oxide layer 130' by the oxygen-containing protrusive structure 122.

With reference to FIG. 6C, a doping process P is performed on the metal oxide layer 130 to reduce the resistivity of the third portion 136 of the metal oxide layer 130 and gradually decrease the resistivity of the second portion 134 of the metal oxide layer 130 away from the first portion 132. For instance, a hydrogen plasma process is performed on the metal oxide layer 130 by applying the first gate 150 as a mask, so that the second portion 134 and the third portion 136 that are not overlapped with the first gate 150 in the normal direction ND of the top surface of the substrate 100 constitute a doped region dp, and the first portion 132 overlapped with the first gate 150 in the normal direction ND of the top surface of the substrate 100 constitutes a channel region ch. In some embodiments, the second portion 134 may constitute a lightly doped region ldp, and the third portion 136 may constitute a heavily doped region hdp. In some embodiments, the width L2 of the oxygen-containing protrusive structure 122 may be larger than the width L1 of the first gate 150, which is conducive to an increase in the distance between the first portion 132 and the third portion 136.

After the hydrogen plasma process, the resistivity of the second portion 134 may gradually decrease away from the first portion 132, and the resistivity of the second portion 134 is higher than the resistivity of the third portion 136.

Figure 6D:
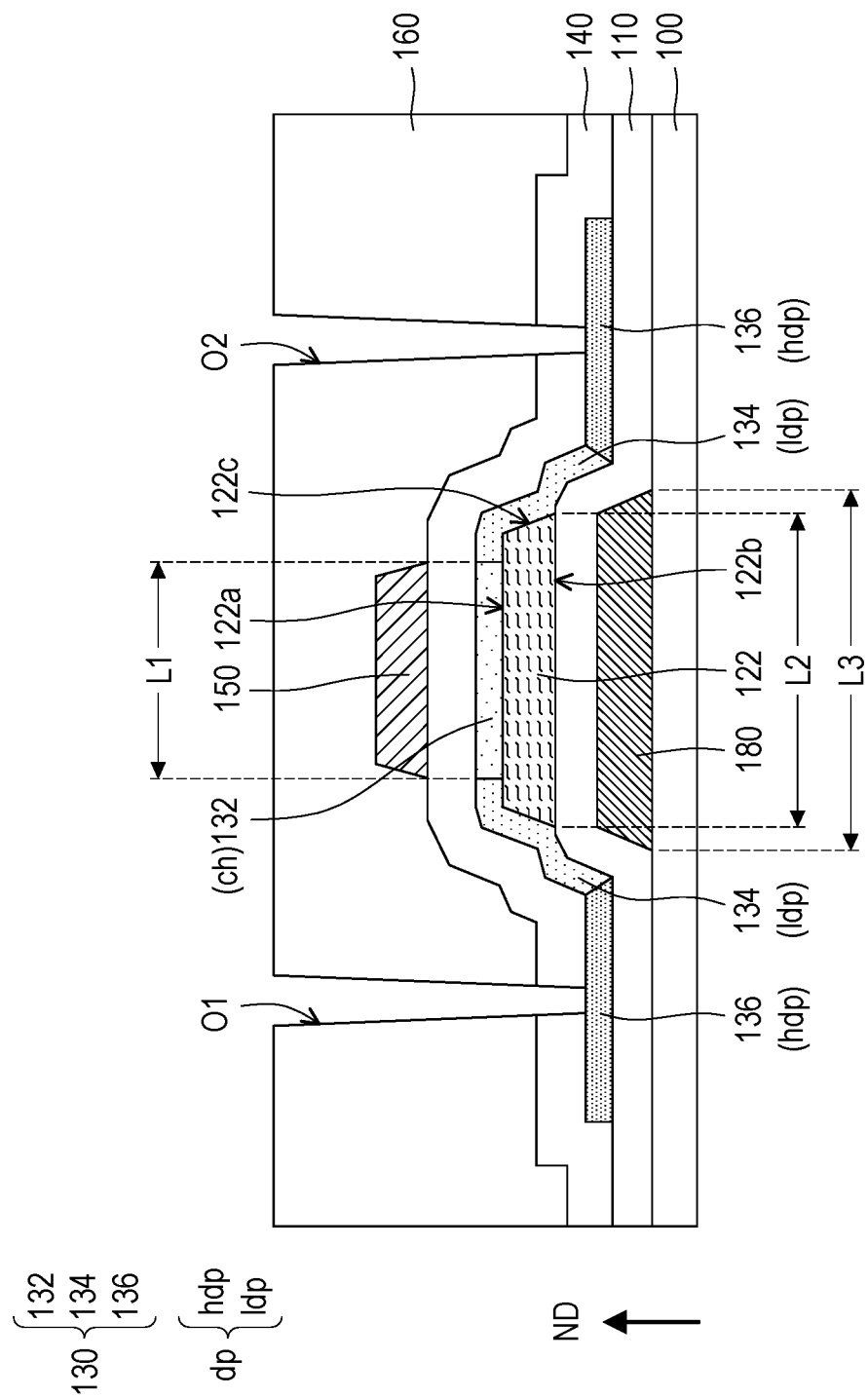

With reference to FIG. 6D, an interlayer dielectric layer 160 is formed on the gate dielectric layer 140 and covers the first gate 150. After that, openings O1 and O2 penetrating the interlayer dielectric layer 160 and the gate dielectric layer 140 are formed, and the openings O1 and O2 are respectively overlapped with the third portion 136 in the normal direction ND of the top surface of the substrate 100.

After that, with reference to FIG. 5, a source 172 and a drain 174 are formed on the interlayer dielectric layer 150 and fill the openings O1 and O2, so as to be electrically connected to the metal oxide layer 130.

After the above process, the fabrication of the semiconductor device 3 is substantially completed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
   a substrate;
   an oxygen-containing protrusive structure, disposed above the substrate and having a first surface, a second surface opposite to the first surface, and a sidewall connected to the first surface and the second surface;
   a buffer layer, disposed between the substrate and the oxygen-containing protrusive structure, wherein a material of the buffer layer is silicon nitride or silicon nitride oxide, and an oxygen concentration of the buffer layer is lower than an oxygen concentration of the oxygen-containing protrusive structure;
   a metal oxide layer, comprising:
   a first portion, covering the first surface of the oxygen-containing protrusive structure;
   a second portion, connected to the first portion and covering at least a portion of the sidewall of the oxygen-containing protrusive structure, wherein a resistivity of the second portion gradually decreases away from the first portion; and
   a third portion, connected to the second portion and extending from the second portion in a direction away from the oxygen-containing protrusive structure;
   a gate dielectric layer, disposed on the metal oxide layer;
   a first gate, disposed on the gate dielectric layer;
   a source and a drain, disposed on the metal oxide layer, wherein the first gate is located between the source and the drain; and
   a second gate, disposed between the substrate and the buffer layer, wherein a width of the second gate is larger than a width of the oxygen-containing protrusive structure, wherein an orthographic projection of the second gate on the substrate has a first point adjacent to the source and a second point adjacent to the drain, and the width of the second gate is a distance between the first point and the second point, and wherein an orthographic projection of the oxygen-containing protrusive structure on the substrate has a third point adjacent to the source and a fourth point adjacent to the drain, and the width of the oxygen-containing protrusive structure is a distance between the third point and the fourth point,
   wherein the gate dielectric layer contacts the buffer layer, the source, the drain, the first portion of the metal oxide layer, the second portion of the metal oxide layer, and the third portion of the metal oxide layer,
   wherein the third portion of the metal oxide layer is in direct contact with the buffer layer but not in direct contact with the oxygen-containing protrusive structure,
   wherein the oxygen-containing protrusive structure has a gradually reduced thickness at an edge portion of the oxygen-containing protrusive structure, and an oxygen concentration of the second portion is gradually decreased along the gradually reduced thickness of the oxygen-containing protrusive structure.

2. The semiconductor device according to claim 1, further comprising an extension structure, wherein the extension structure is located between the third portion and the substrate and is connected to the oxygen-containing protrusive structure integrally, and a thickness of the oxygen-containing protrusive structure is larger than a thickness of the extension structure.

3. The semiconductor device according to claim 1, wherein a resistivity of the first portion is higher than the resistivity of the second portion, and the resistivity of the second portion is higher than a resistivity of the third portion.

4. The semiconductor device according to claim 1, wherein an oxygen concentration of the first portion is higher than the oxygen concentration of the second portion, and the oxygen concentration of the second portion is higher than an oxygen concentration of the third portion.

5. The semiconductor device according to claim 1, wherein a material of the oxygen-containing protrusive structure comprises silicon oxide or silicon nitride oxide.

6. The semiconductor device according to claim 1, wherein the first gate is overlapped with the first portion in a normal direction of a top surface of the substrate, and the first gate is not overlapped with the second portion in the normal direction of the top surface of the substrate.

7. The semiconductor device according to claim 1, wherein the width of the oxygen-containing protrusive structure is larger than a width of the first gate.

8. A manufacturing method of a semiconductor device, comprising:
   providing a substrate;
   forming a second gate on the substrate;
   forming a buffer layer on the substrate and the second gate, wherein a material of the buffer layer is silicon nitride or silicon nitride oxide;
   forming an oxygen-containing protrusive structure above the buffer layer, wherein the oxygen-containing protrusive structure has a first surface, a second surface opposite to the first surface, and a sidewall connected to the first surface and the second surface, wherein an oxygen concentration of the buffer layer is lower than an oxygen concentration of the oxygen-containing protrusive structure;
   forming a metal oxide layer on the oxygen-containing protrusive structure, wherein the metal oxide layer comprises:
   a first portion, covering the first surface of the oxygen-containing protrusive structure;

a second portion, connected to the first portion and covering at least a portion of the sidewall of the oxygen-containing protrusive structure; and a third portion, connected to the second portion and extending from the second portion in a direction away from the oxygen-containing protrusive structure;

forming a gate dielectric layer on the metal oxide layer;

forming a first gate on the gate dielectric layer, wherein the first gate is overlapped with the metal oxide layer in a normal direction of a top surface of the substrate; and performing a doping process on the metal oxide layer to reduce a resistivity of the third portion of the metal oxide layer and gradually decreasing a resistivity of the second portion of the metal oxide layer away from the first portion; and forming a source and a drain on the metal oxide layer, wherein the first gate is located between the source and the drain, wherein a width of the second gate is larger than a width of the oxygen-containing protrusive structure, wherein an orthographic projection of the second gate on the substrate has a first point adjacent to the source and a second point adjacent to the drain, and the width of the second gate is a distance between the first point and the second point, and wherein an orthographic projection of the oxygen-containing protrusive structure on the substrate has a third point adjacent to the source and a fourth point adjacent to the drain, and the width of the oxygen-containing protrusive structure is a distance between the third point and the fourth point, wherein the gate dielectric layer contacts the buffer layer, the source, the drain, the first portion of the metal oxide layer, the second portion of the metal oxide layer, and the third portion of the metal oxide layer, wherein the third portion of the metal oxide layer is in direct contact with the buffer layer but not in direct contact with the oxygen-containing protrusive structure, wherein the oxygen-containing protrusive structure has a gradually reduced thickness at an edge portion of the oxygen-containing protrusive structure, and an oxygen concentration of the second portion is gradually decreased along the gradually reduced thickness of the oxygen-containing protrusive structure.

9. The manufacturing method according to claim 8, wherein the step of forming the oxygen-containing protrusive structure above the substrate comprises:

depositing an oxygen-containing material layer on the substrate; and patterning the oxygen-containing material layer to form the oxygen-containing protrusive structure.

10. The manufacturing method according to claim 9, wherein the oxygen-containing material layer is patterned to form the oxygen-containing protrusive structure and an extension structure, the extension structure is connected to the oxygen-containing protrusive structure integrally, and a thickness of the oxygen-containing protrusive structure is larger than a thickness of the extension structure.

11. The semiconductor device according to claim 1, wherein the third portion of the metal oxide layer contacts and covers a portion of the buffer layer, and a thickness of the portion of the buffer layer is smaller than a thickness of the second gate.

12. The semiconductor device according to claim 1, wherein the third portion of the metal oxide layer contacts and covers a portion of the buffer layer, and wherein a distance between a top surface of the portion of the buffer layer and a top surface of the substrate is smaller than a distance between a top surface of the second gate and the top surface of the substrate.

* * * * *